United States Patent
Wang et al.

(10) Patent No.: US 11,282,274 B1
(45) Date of Patent: Mar. 22, 2022

(54) SYSTEMS AND METHODS FOR CONSTRUCTING CONFORMAL CONNECTIONS BETWEEN MESHES

(71) Applicant: Ansys, Inc., Canonsburg, PA (US)

(72) Inventors: Wenyan Wang, Wilmette, IL (US); Shuli Yang, Wilmette, IL (US); Jan Ivan Vilhem Frykestig, Torsby (SE)

(73) Assignee: Ansys, Inc., Canonsburg, PA (US)

( * ) Notice: Subject to any disclaimer, the term of this patent is extended or adjusted under 35 U.S.C. 154(b) by 1009 days.

(21) Appl. No.: 15/955,849

(22) Filed: Apr. 18, 2018

Related U.S. Application Data

(60) Provisional application No. 62/487,568, filed on Apr. 20, 2017.

(51) Int. Cl.
*G06T 17/20* (2006.01)
*G06F 30/20* (2020.01)

(52) U.S. Cl.
CPC .............. *G06T 17/20* (2013.01); *G06F 30/20* (2020.01)

(58) Field of Classification Search
CPC ................................ G06F 30/20; G06T 17/20
See application file for complete search history.

(56) References Cited

U.S. PATENT DOCUMENTS

| | | | |
|---|---|---|---|
| 8,390,620 B1 * | 3/2013 | Staten ..................... | G06T 17/20 345/423 |
| 2012/0203512 A1 * | 8/2012 | Shahpar .................. | G06T 17/20 703/1 |

OTHER PUBLICATIONS

Nguyen, J., Park, S. I., Rosen, D. W., Folgar, L., & Williams, J. (Aug. 2012). Conformal lattice structure design and fabrication. In Solid Freeform Fabrication Symposium, Austin, TX (pp. 138-161). (Year: 2012).*

Maréchal, L. (2009). Advances in octree-based all-hexahedral mesh generation: handling sharp features. In Proceedings of the 18th international meshing roundtable (pp. 65-84). Springer, Berlin, Heidelberg. (Year: 2009).*

* cited by examiner

*Primary Examiner* — Bijan Mapar
(74) *Attorney, Agent, or Firm* — Jones Day

(57) ABSTRACT

Computer-implemented systems and methods for generating a mesh and conformally connecting the mesh to an existing mesh are provided. The existing mesh is displayed via a graphical user interface (GUI) of a computer-aided design modeling system using a processing system. A polyhedral mesh is generated in an empty space adjacent to the existing mesh using the processing system. The generating of the polyhedral mesh includes (i) defining the empty space as a first surface mesh comprising triangles, quadrilaterals, polygonals, or a mixture thereof, (ii) generating a dual of the first surface mesh to form a second surface mesh, the empty space being enclosed by the second surface mesh, and (iii) filling a gap region between the first and second surface meshes with the polyhedral mesh and conformally connecting the polyhedral mesh to the existing mesh using the processing system.

20 Claims, 16 Drawing Sheets

SYSTEMS AND METHODS FOR CONSTRUCTING CONFORMAL CONNECTIONS BETWEEN MESHES

CROSS-REFERENCE TO RELATED APPLICATIONS

This application claims priority to U.S. Provisional Application No. 62/487,568, filed Apr. 20, 2017, entitled "Systems and Methods for Constructing Conformal Connections Between Meshes," which is incorporated herein by reference in its entirety.

FIELD

The present description relates to computer-based techniques for constructing conformal connections between meshes.

BACKGROUND

Computer-aided-design (CAD) software allows a user to construct and manipulate complex three-dimensional models. A CAD model usually includes a collection of interconnected topological entities (e.g., vertices, edges, faces, bodies), geometric entities (e.g., points, trimmed curves, trimmed surfaces), and/or meshes. A mesh often includes a piecewise discretization of the CAD model or a portion thereof. CAD models, meshes, and computer-based analysis techniques are used in modeling the behavior of physical (e.g., real-world) objects.

SUMMARY

Computer-implemented systems and methods for constructing conformal connections between meshes are provided. In a computer-implemented method, an existing mesh is displayed via a graphical user interface (GUI) of a computer-aided design modeling system using a processing system. A polyhedral mesh is generated in an empty space adjacent to the existing mesh using the processing system. The generating of the polyhedral mesh includes (i) defining the empty space as a first surface mesh comprising triangles, quadrilaterals, polygonals, or a mixture thereof, (ii) generating a dual of the first surface mesh to form a second surface mesh, wherein the empty space is enclosed by the second surface mesh, and (iii) filling a gap region between the first and second surface meshes with the polyhedral mesh and conformally connecting the polyhedral mesh to the existing mesh using the processing system.

A system for constructing conformal connections between meshes includes a processing system and computer-readable memory in communication with the processing system encoded with instructions for commanding the processing system to execute steps. In executing the steps, an existing mesh is displayed via a graphical user interface (GUI) of a computer-aided design modeling system. A polyhedral mesh is generated in an empty space adjacent to the existing mesh. The generating of the polyhedral mesh includes (i) defining the empty space as a first surface mesh comprising triangles, quadrilaterals, polygonals, or a mixture thereof, wherein a volume mesh is associated with a subset of the first surface mesh, (ii) generating a dual of the first surface mesh to form a second surface mesh, wherein the empty space is enclosed by the second surface mesh, and (iii) filling a domain bounded by the second surface mesh with the polyhedral mesh and conformally connecting the polyhedral mesh to the existing mesh.

A non-transitory computer-readable storage medium for constructing conformal connections between meshes comprises computer executable instructions which, when executed, cause a processing system to execute steps. In executing the steps, an existing mesh is displayed via a graphical user interface (GUI) of a computer-aided design modeling system. A new mesh is generated in an empty space adjacent to the existing mesh. The generating of the new mesh includes (i) defining the empty space as a first surface mesh comprising triangles, quadrilaterals, polygonals, or a mixture thereof, wherein a volume mesh is associated with a subset of the first surface mesh, (ii) generating a dual of the first surface mesh to form a second surface mesh, wherein an empty space is enclosed by the second surface mesh, and (iii) filling the empty space with a polyhedral mesh and conformally connecting the existing mesh.

In another example of a computer-implemented method, an existing mesh is displayed via a graphical user interface (GUI) of a computer-aided design modeling system using a processing system. A new mesh is generated in an empty space adjacent to the existing mesh using the processing system.

A system for constructing conformal connections between meshes includes a processing system and computer-readable memory in communication with the processing system encoded with instructions for commanding the processing system to execute steps. In executing the steps, an existing mesh is displayed via a graphical user interface (GUI) of a computer-aided design modeling system. A new mesh is generated in an empty space adjacent to the existing mesh.

A non-transitory computer-readable storage medium for constructing conformal connections between meshes comprises computer executable instructions which, when executed, cause a processing system to execute steps. In executing the steps, an existing mesh is displayed via a graphical user interface (GUI) of a computer-aided design modeling system. A new mesh is generated in an empty space adjacent to the existing mesh.

The subject matter described herein provides many technical advantages. As described below, the computer-based techniques of the present disclosure improve the functioning of a computer system as compared to conventional approaches because the techniques described herein enable the generation and connection of a new mesh to an existing mesh (seed mesh) in a manner that is more accurate and/or efficient (e.g., faster, with smaller memory requirements, etc.) and/or has a reduced processing burden as versus conventional approaches (e.g., non-conformal or mapped approaches). The computer-based techniques achieve such improvements through the use of the "face-based" and the "cell-based" connection procedures described in further detail below. Further, in accordance with embodiments of the present disclosure, a physical object may be built or modified. Specifically, in embodiments, the meshes described herein represent a physical object or a portion thereof. Physical data (e.g., material properties, dimensions, etc.) associated with the physical object may be used in conjunction with the meshes. A computer-based analysis of the meshes may be performed, such as a computational fluid dynamics (CFD) analysis or another type of analysis. Subsequently, the physical object may be built or modified based on the computer-based analysis. These technical advantages and others of the present disclosure are described in detail below.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

FIGS. 19A-24 illustrate some of the ways for connecting the seed mesh to the generated poly mesh in the empty space, in accordance with embodiments of the present disclosure.

DETAILED DESCRIPTION

Figure 1:
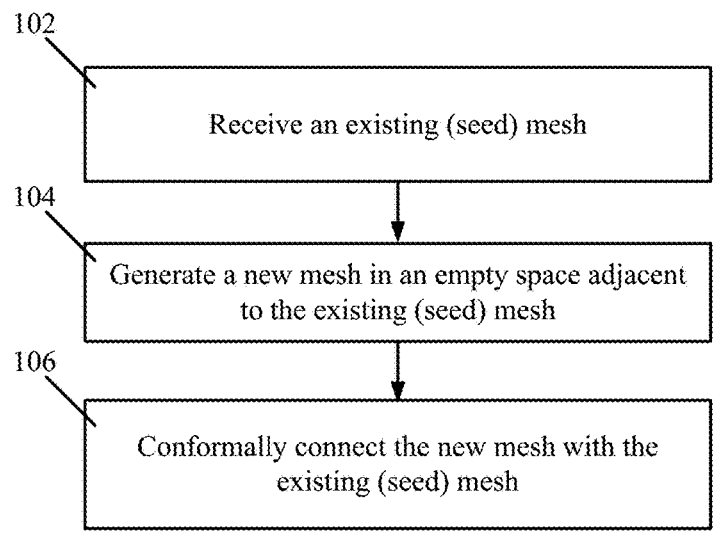
FIG. 1 is a flowchart depicting operations of an example method for generating a mesh and conformally connecting the mesh to an existing mesh, in accordance with embodiments of the present disclosure.

The present disclosure relates generally to computer-based techniques for constructing conformal connections between meshes. To illustrate features of the computer-implemented systems and methods described herein, reference is made to FIG. 1. This figure is a flowchart depicting operations of an example method for generating a mesh and conformally connecting the mesh to an existing mesh, in accordance with embodiments of the present disclosure. At 102, an existing mesh is received. The existing mesh is a mesh that has been generated previously and may be referred to as a "seed mesh." In embodiments, the existing mesh is displayed via a graphical user interface (GUI) of a computer-aided design modeling system.

At 104, a new mesh is generated in an empty space adjacent to the existing mesh. Like the existing mesh, the new mesh may be displayed via the GUI. At 106, the new mesh is conformally connected to the existing mesh. As referred to herein, a "conformal" connection between two meshes is a connection that has no non-shared faces, edges, and vertices at the common boundaries. The present inventors have observed a need for improved techniques for generating the new mesh in the empty space adjacent to the existing mesh and conformally connecting the new mesh to the existing mesh.

Embodiments of the present disclosure are directed to computer-implemented systems and methods that may satisfy one or more of these needs. Specifically, the computer-implemented systems and methods described herein are used to form conformal connections between arbitrary polyhedral volume meshes. Such conformal connections may be referred to as "poly-connections." The computer-implemented systems and methods described herein may also be used to form connections between volume meshes and surface meshes.

In some embodiments described herein, a "face-based" procedure for creating the connections is utilized. In accordance with the face-based procedure, conformal connections are formed between a poly mesh and a regular mesh or another poly mesh, or a hanging node mesh. Further, the face-based connection procedure does not modify the connectivity of the mesh faces that need to be preserved, in embodiments. The face-based connection procedure may also be used to conformally connect poly volume meshes to surface meshes. These aspects and others of the face-based connection procedure are described throughout this disclosure and more specifically with reference to FIGS. 9-15.

In other embodiments, a "cell-based" procedure is utilized for creating the above-described connections. In accordance with the cell-based connection procedure, connections are formed between poly meshes and a regular mesh or another poly mesh, or a hanging node mesh. In embodiments, for the cell-based connection procedure, the first layer of cells in the seed mesh are modified by the connection procedure, but otherwise the seed mesh connectivity is unchanged. These aspects and others of the cell-based connection procedure are described throughout this disclosure and more specifically with reference to FIGS. 14-24.

Figure 2A:
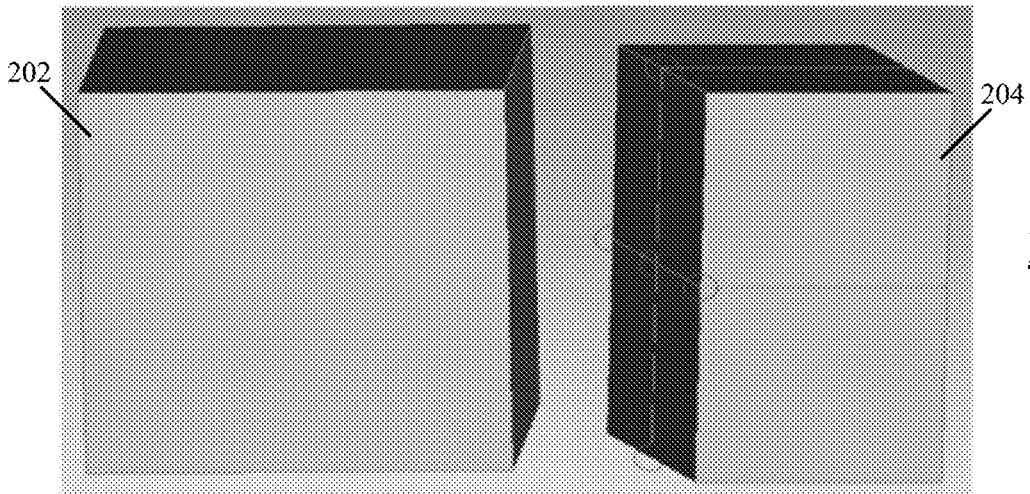
FIGS. 2A and 2B depict a hanging-node mesh containing non-conformal vertices, in accordance with embodiments of the present disclosure.
Figure 2B:
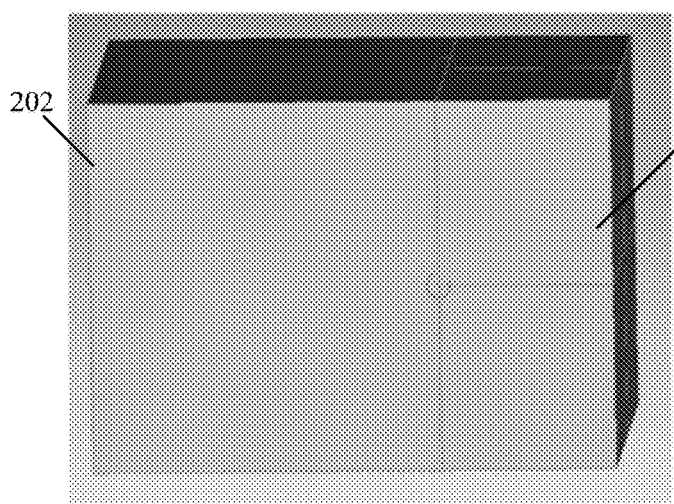

As provided herein, the face-based and cell-based procedures construct conformal connections between poly meshes, regular meshes, and hanging node meshes. A poly mesh includes arbitrary convex polyhedral. By contrast, a regular mesh includes tetrahedra, pyramids, wedges, or hexahedra. A hanging node mesh contains non-conformal vertices. FIGS. 2A and 2B depict a hanging-node mesh containing non-conformal vertices, in accordance with embodiments of the present disclosure. Specifically, FIG. 2A illustrates meshes 202 and 204 in a separated (e.g., unconnected) state. In FIG. 2B, the meshes 202 and 204 are connected as illustrated in the figure.

All meshes discussed herein are formed of polyhedra. As referred to herein, the terms "poly" and "polyhedral" denote cells with an arbitrary number of vertices and faces. The term "polyhedral" is also used herein in a generic sense when formally referring to polygons, such that there is no unnecessary distinguishing between two and three dimensions. As referred to herein, the term "regular mesh" denotes standard cells like tetrahedra, wedge, pyramid, hexahedra, etc. As referred to herein, the term "hanging node mesh" denotes meshes of the type shown in FIGS. 2A and 2B, where there is only one hanging node per face or edge (e.g., the so-called 1-to-2 refinement rule is applied).

Both the face-based and cell-based connection procedures described herein utilize the concept of duality, which is known to persons of ordinary skill in the art. Under the concept of duality, (i) the dual to a cell is a vertex, (ii) the dual to a face is an edge, (iii) the dual to an edge is a face, and (iv) the dual to a vertex is a cell. To illustrate this, reference is made to FIGS. 3A, 3B, 3C, and 3D. These figures depict cell, face, edge, and vertex, respectively, of a primal mesh for the purpose of illustrating the concept of duality, in accordance with embodiments of the present disclosure.

Figure 3A:
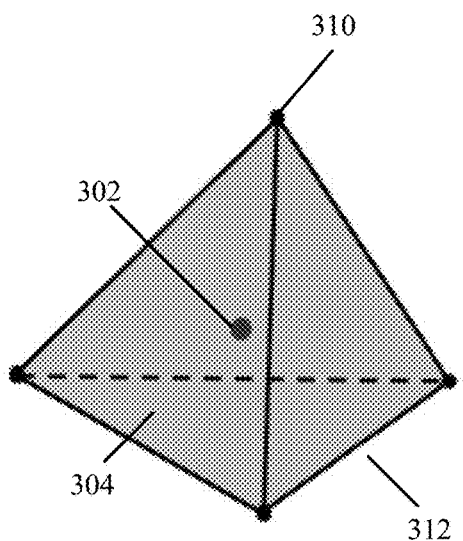
FIGS. 3A, 3B, 3C, and 3D depict cell, face, edge, and vertex, respectively, of a primal mesh for the purpose of illustrating the concept of duality, in accordance with embodiments of the present disclosure.
Figure 3B:
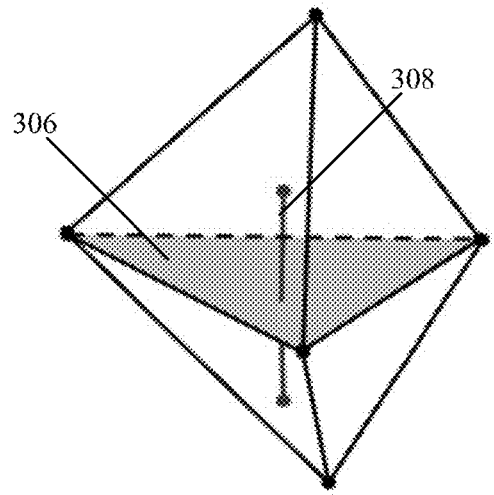
Figure 3C:
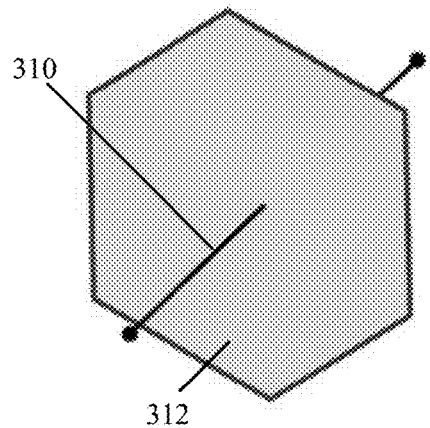
Figure 3D:
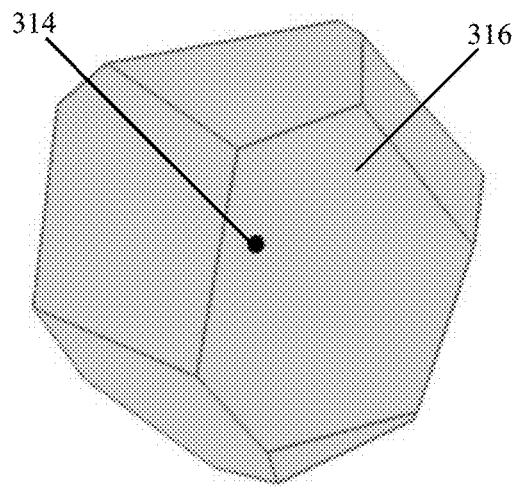

In particular, FIG. 3A depicts a cell 304 and its dual mesh vertex 302. As referred to herein, a "vertex" is a point at the corner of a cell, and a "cell" is a three-dimensional (3D) space constrained by faces. FIG. 3B depicts a face 306 and its dual edge 308. As referred to herein, a "face" is a two-dimensional space surrounded by straight lines, and an "edge" connects two vertices. FIG. 3C depicts an edge 310 and its dual face 312. FIG. 3D depicts a vertex 314 and its dual cell 316. The use of duality in the face-based and cell-based connection procedures is described in further detail below.

In the face-based and cell-based procedures described herein, the input to the respective computer algorithms is a domain bounded by a surface mesh. As described above with reference to FIG. 1, in embodiments described herein, a new mesh is generated in an empty space adjacent to an existing mesh (e.g., a seed mesh). In these embodiments, the empty space adjacent to the existing mesh is defined by the input surface mesh. The face-based and cell-based procedures are configured to fill the domain bounded by the surface mesh with a polyhedral mesh. The polyhedral mesh comprises a portion of the "new mesh" described herein that is conformally connected to the existing mesh. The use of the polyhedral mesh may allow for a more accurate solution when the mesh structure is analyzed via CFD solvers and other computer-based analysis methods, as compared to the use of pyramid, tetrahedral meshes, etc. The face-based and cell-based procedures enable the generated polyhedral mesh to be conformally connected to some given volume or surface mesh (e.g., the existing seed mesh, as described herein).

Figure 4:
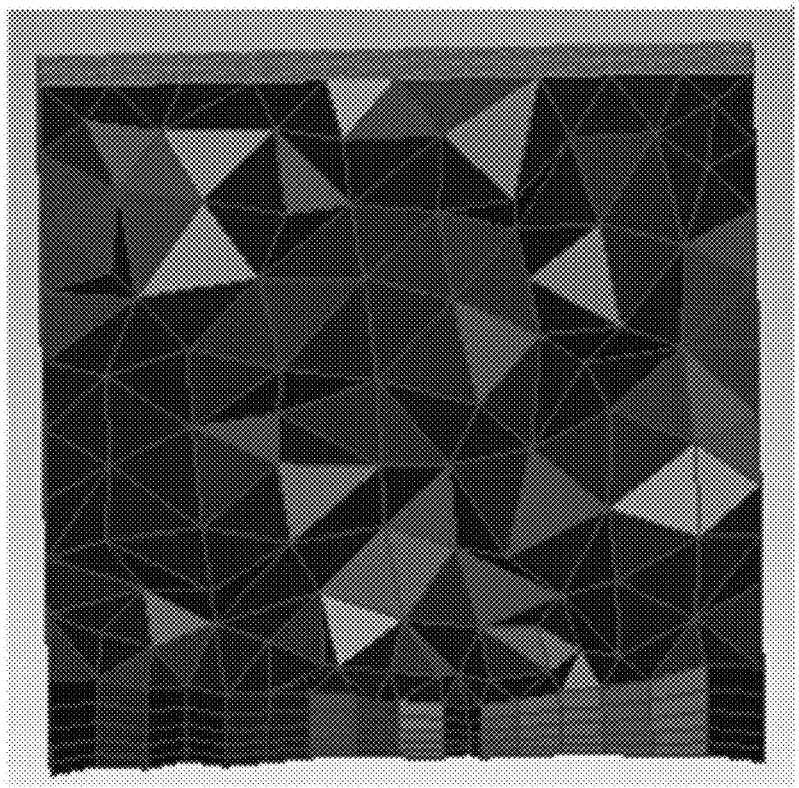
FIG. 4 illustrates a domain filled with a hybrid primal mesh including wedges and tetrahedral (e.g., a regular mesh), in accordance with embodiments of the present disclosure.
Figure 5:
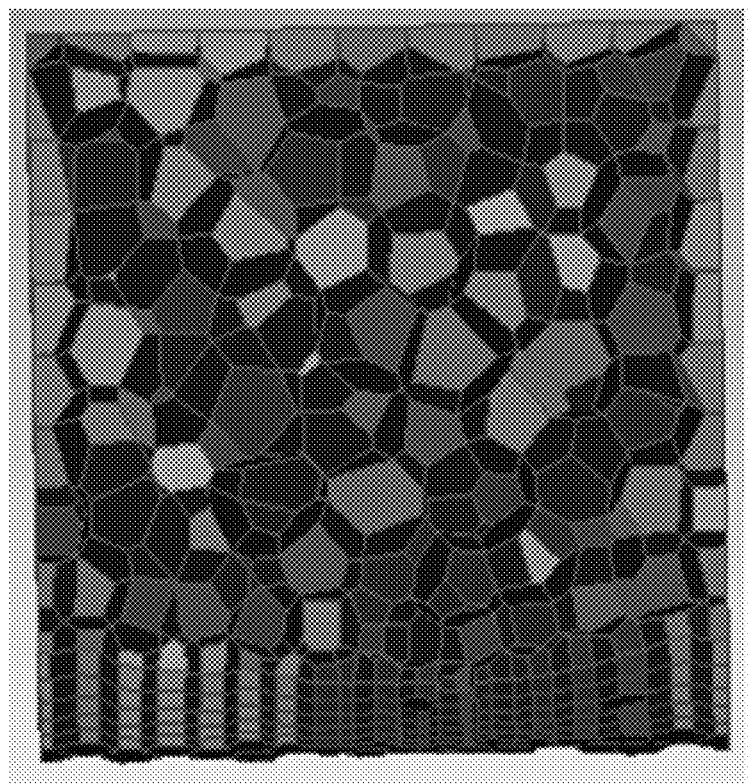
FIG. 5 illustrates a dual poly mesh corresponding to the hybrid mesh of FIG. 4, in accordance with embodiments of the present disclosure.

To illustrate a polyhedral mesh, as utilized in embodiments described herein, reference is made to FIGS. 4 and 5. FIG. 4 illustrates a domain filled with a hybrid primal mesh including wedges and tetrahedral (e.g., a regular mesh), in accordance with embodiments of the present disclosure. FIG. 5 illustrates a dual polyhedral mesh corresponding to the hybrid mesh of FIG. 4, in accordance with embodiments of the present disclosure. The dual poly mesh of FIG. 5 is obtained by taking the dual of the hybrid mesh of FIG. 4, in embodiments.

Figure 6:
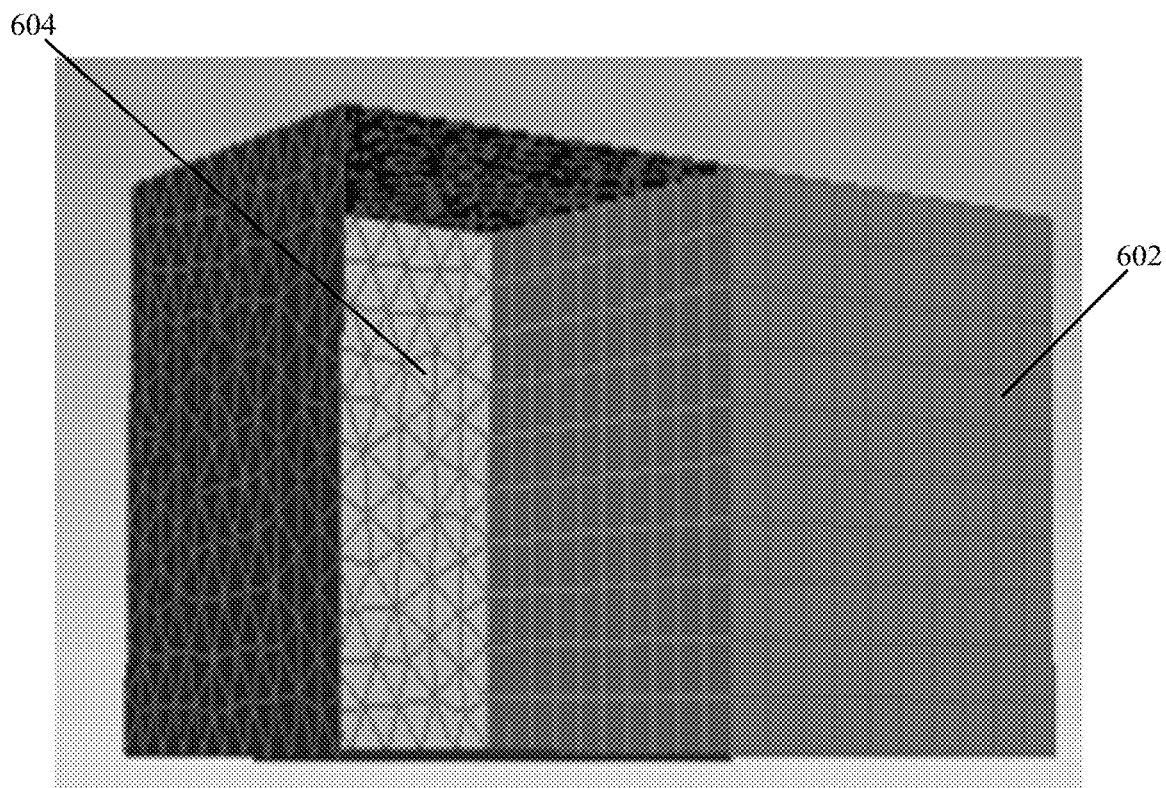
FIGS. 6 and 7 depict an existing mesh and an empty space adjacent to the existing mesh, in accordance with embodiments of the present disclosure.
Figure 7:
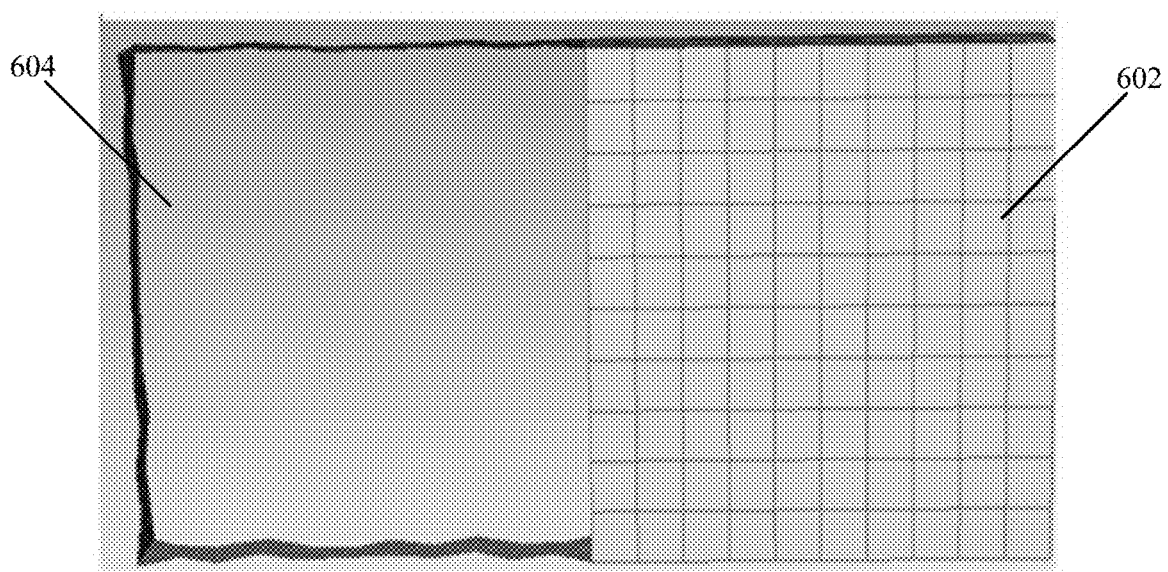

As explained above, the input to the computer algorithms described herein is a domain bounded by a surface mesh. The face-based connection procedure may be used when part or all of the boundary mesh defining the input domain cannot be modified but should be part of the resulting polyhedral mesh. To illustrate this, reference is made to FIGS. 6 and 7. These figures depict an existing mesh 602 and an empty space 604 adjacent to the existing mesh 602, in accordance with embodiments of the present disclosure. In accordance with embodiments of the present disclosure, computer-based techniques described herein are used to fill the empty space 604 with a new mesh and to conformally connect the new mesh to the existing mesh 602. Under the face-based connection procedure, the shared face between the two boxes 602, 604 remains unchanged. These aspects of the face-based connection procedure are described in further detail below.

Figure 8:
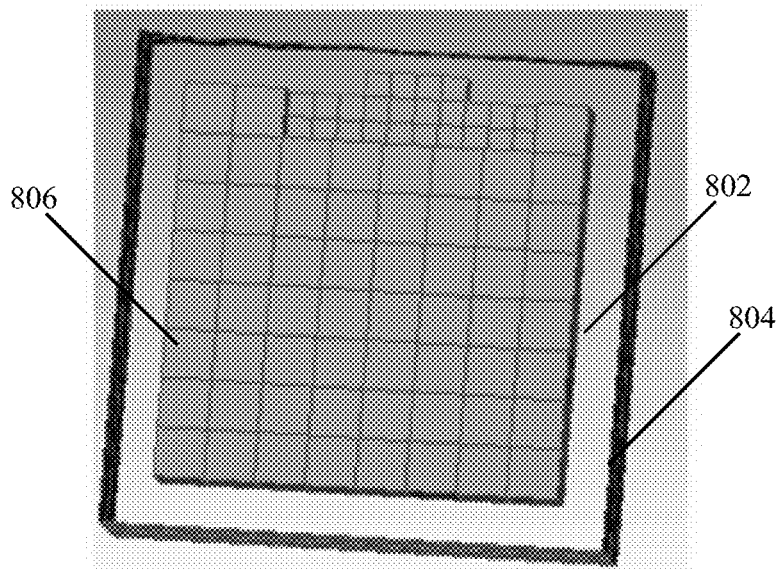
FIG. 8 illustrates a gap region into which a poly mesh is filled, in accordance with embodiments of the present disclosure.

In embodiments of the cell-based connection procedure, a polyhedral mesh is used to fill in a gap region. To illustrate this, reference is made to FIG. 8. This figure illustrates a gap region 802 into which a polyhedral mesh is filled, in accordance with embodiments of the present disclosure. In embodiments, the gap region 802 is formed between an input surface mesh 804 and a hexahedral mesh 806. The polyhedral mesh that fills the gap region 802 is conformally connected to the hexahedral mesh 806 by modifying the outermost layer of 806. These aspects of the cell-based connection procedure are described in further detail below.

In accordance with embodiments of the present disclosure, a physical object may be built or modified. Specifically, in embodiments, to model behavior of the physical object, a computer-based model corresponding to the physical object is generated. To perform certain analyses of the computer-based model (e.g., computational fluid dynamics (CFD) analyses, etc.), the meshes described herein may be generated, where such meshes may be piecewise discretizations of the computer-based model or a portion thereof. Physical data (e.g., material properties, dimensions, etc.) associated with the physical object may be used with the meshes to model the physical object, and various computer-based analyses can be performed using the meshes. The GUI of the computer-aided design modeling system may enable a user to view the model and mesh and to make various changes to them (e.g., geometry changes, changes to mesh parameters, etc.). Subsequently, the physical object may be built or modified based on the computer-based analyses.

Figure 9:
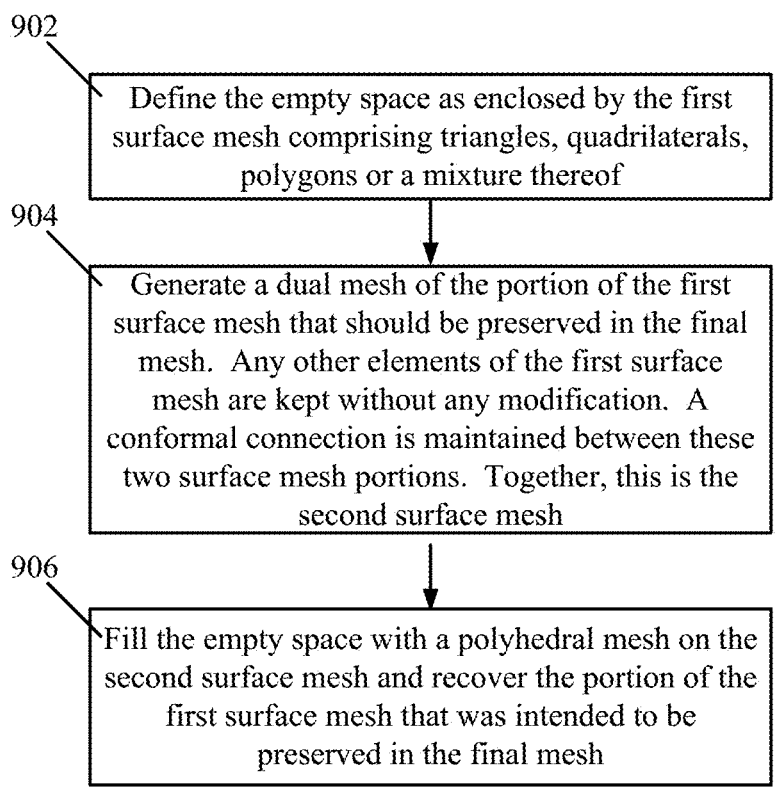
FIG. 9 is a flowchart depicting operations of a face-based connection method, in accordance with embodiments of the present disclosure.

To illustrate features of the face-based connection procedure, reference is made to FIGS. 9-15. FIG. 9 is a flowchart depicting operations of a face-based connection procedure, in accordance with the present disclosure. In embodiments of the present disclosure, an existing mesh (e.g., seed mesh) is received, and a new mesh is generated in an empty space adjacent to the existing mesh. At operation 902 of FIG. 9, the empty space is defined as a first surface mesh comprising triangles, quadrilaterals, polygonals, or a mixture thereof. As noted in FIG. 9, the empty space is enclosed by the first surface mesh. Thus, in the face-based connection procedure, the input is a domain defined by a general surface mesh. In accordance with the face-based connection procedure, the input surface mesh is replaced with a polyhedral surface mesh except for certain specified surface elements of the input surface mesh that remain unchanged.

At operation 904 of FIG. 9, a dual of the portion of the first surface mesh is generated to form a second surface mesh. As noted in FIG. 9, a dual mesh of the portion of the first surface mesh that should be preserved in the final mesh is generated. Any other elements of the first surface mesh are kept without any modification. A conformal connection is maintained between these two surface mesh portions. Together, this is the second surface mesh. At operation 906, the gap region is filled with a polyhedral mesh, and the portion of the first surface mesh to be preserved is recovered in the boundary of the polyhedral mesh. These aspects of the face-based connection procedure are described in further detail below with reference to FIGS. 10A-15.

Figure 10A:
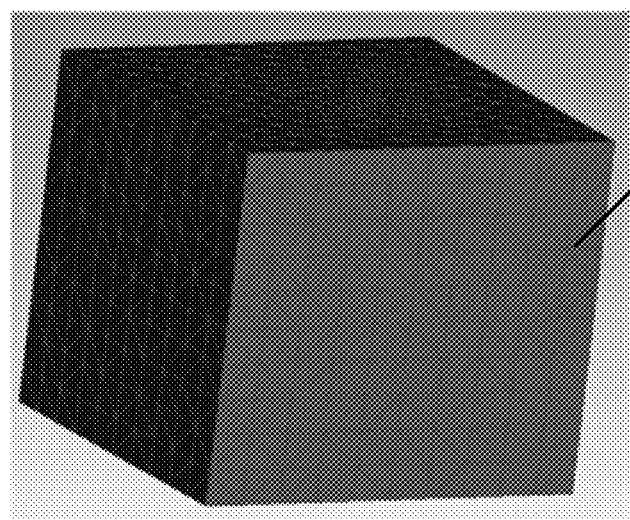
FIG. 10A depicts an outer boundary surface mesh, in accordance with embodiments of the present disclosure.
Figure 10B:
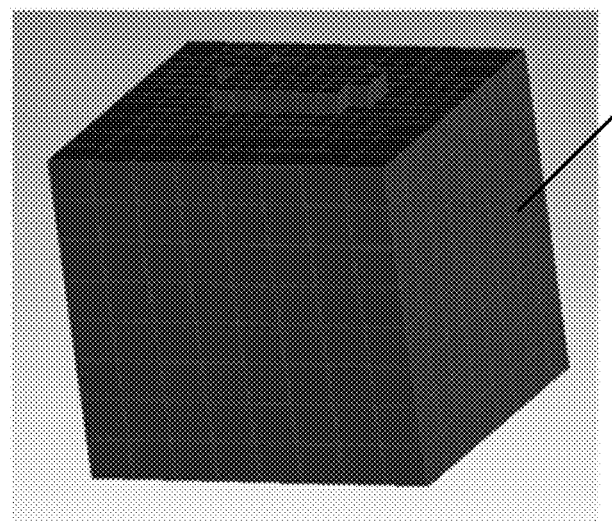
FIG. 10B depicts a hexahedral mesh boundary surface mesh, in accordance with embodiments of the present disclosure.
Figure 10C:
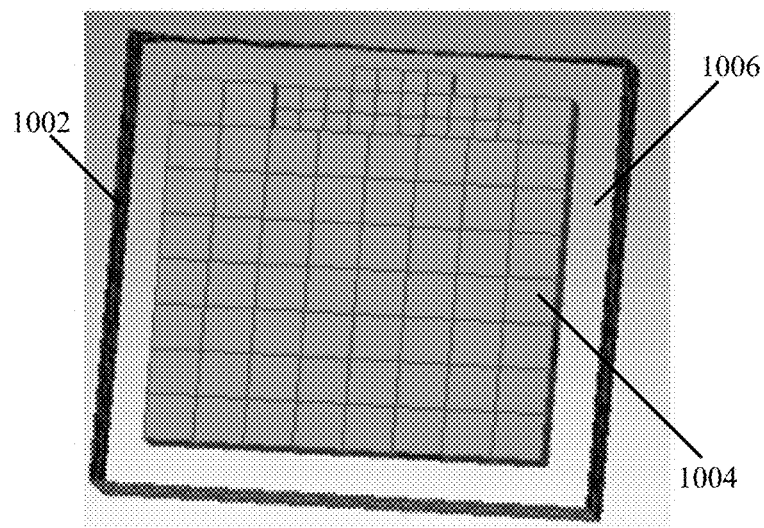
FIG. 10C illustrates a gap region to be filled with a poly mesh, in accordance with embodiments of the present disclosure.

As explained above, in the face-based connection procedure, the input mesh is a surface mesh that defines the empty space. The input mesh comprises triangles, quadrilaterals, polygonals, or a mixture thereof, in embodiments. FIG. 10A shows an example outer boundary surface mesh 1002, which is allowed to be modified, while FIG. 10B shows the surface mesh 1004 that needs to be preserved in the final poly mesh. FIG. 10C shows the gap region 1006 that exists between the surface mesh 1002 and the surface mesh 1004. In embodiments of the face-based connection procedure, the gap region 1006 is filled with a polyhedral mesh. This is described below.

Figure 11A:
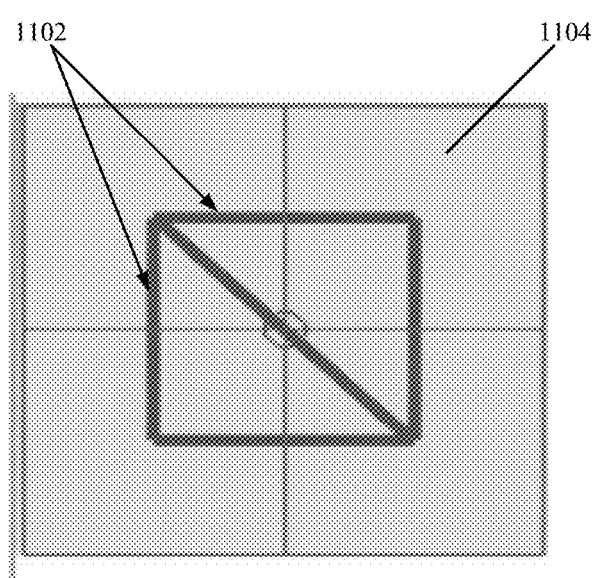
FIGS. 11A, 11B, 11C, and 11D depict initial meshes and triangular meshes generated by taking the dual of the respective initial meshes, in accordance with embodiments of the present disclosure.
Figure 11B:
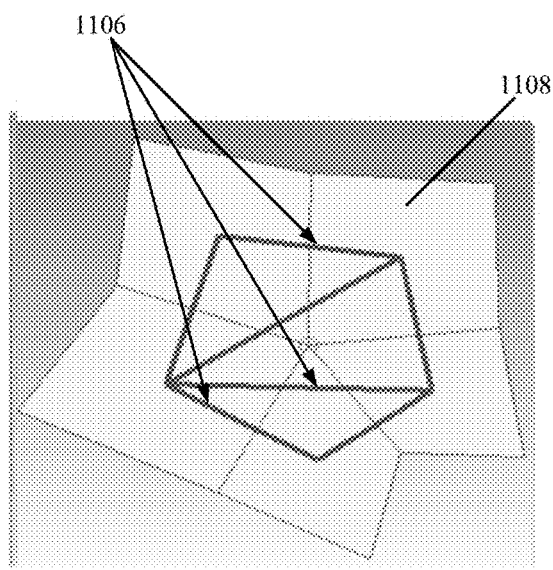
Figure 11C:
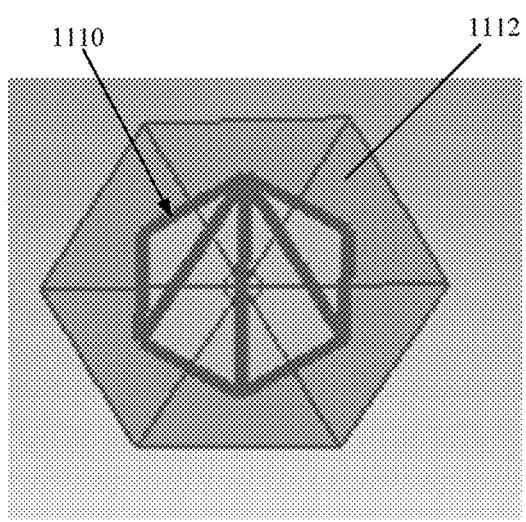
Figure 11D:
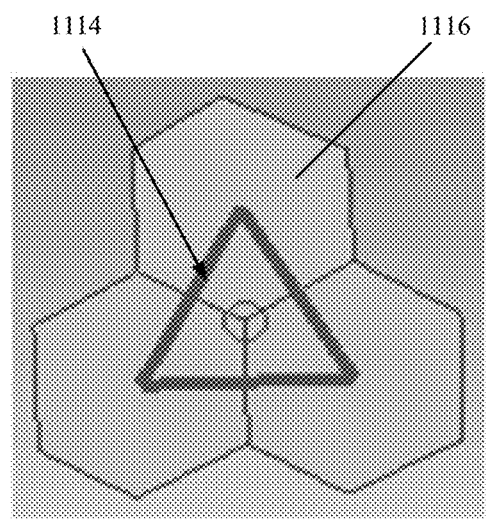

In embodiments of the face-based connection procedure, FIGS. 11A-11D illustrate the relation between the input surface mesh and its dual mesh. FIG. 11A shows an example generation of dual triangles 1102 for a structured quadrilateral mesh 1104. FIG. 11B shows an example generation of dual triangles 1106 for an unstructured quadrilateral mesh 1108. FIG. 11C shows an example generation of dual triangles 1110 for a triangular surface mesh 1112. FIG. 11D shows an example generation of dual triangles 1114 for a polyhedral surface mesh 1116.

Figure 12:
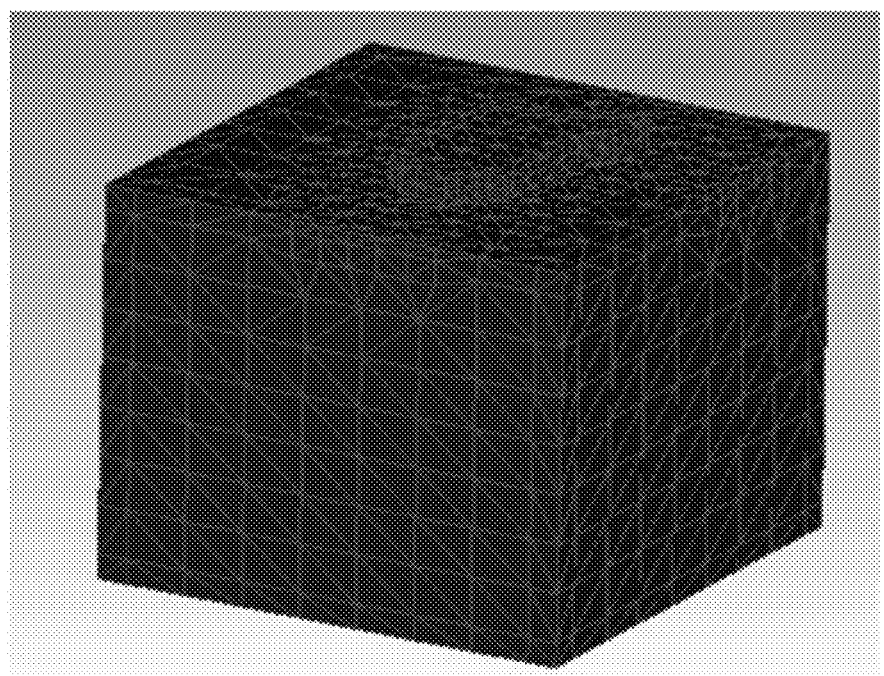
FIG. 12 depicts a dual triangular surface mesh of the surface mesh of FIG. 10B, in accordance with embodiments of the present disclosure.

To illustrate another example of generating a dual of a surface mesh to form a triangular surface mesh, reference is made to FIG. 12. This figure depicts a dual triangular surface mesh of the surface mesh of FIG. 10B, in accordance with embodiments of the present disclosure.

Figure 13:
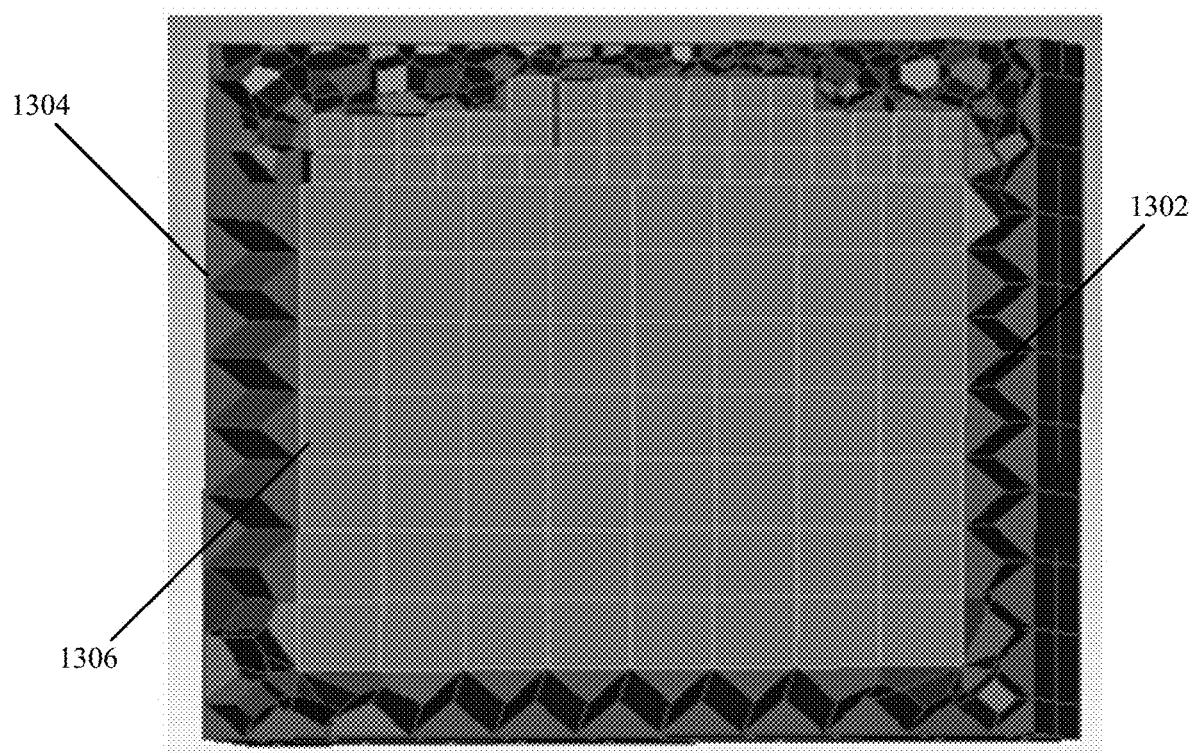
FIG. 13 depicts the gap region between outer boundary and hanging node hexahedral mesh boundary filled with poly mesh, in accordance with embodiments of the present disclosure.

Next, in embodiments of the face-based connection procedure, a gap region is filled with a poly mesh. To illustrate this, reference is made to FIG. 13. This figure depicts an example gap region 1302 between outer boundary surface mesh 1304 and hanging node hexahedral mesh boundary 1306 filled with a polyhedral mesh, in accordance with embodiments of the present disclosure. Specifically, FIG. 13 shows an example polyhedral mesh generated for the gap region 1006 shown in FIG. 10C.

Figure 14:
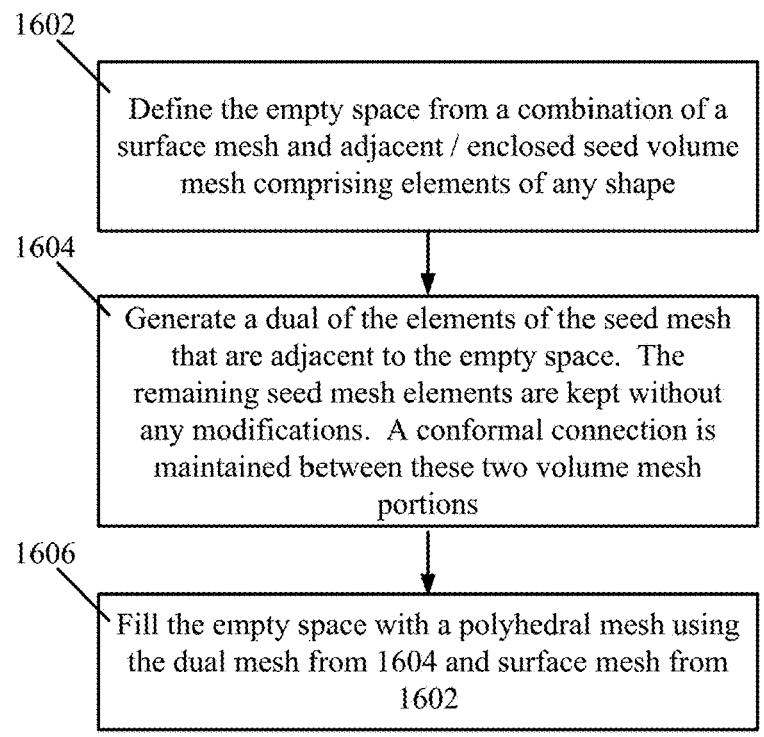
FIG. 14 is a flowchart depicting operations of a cell-based connection method, in accordance with embodiments of the present disclosure.

To illustrate features of the cell-based connection procedure described herein, reference is made to FIGS. 14-24. FIG. 14 is a flowchart depicting operations of a cell-based connection procedure, in accordance with embodiments of the present disclosure. As described herein, in embodiments of the present disclosure, an existing mesh (e.g., seed mesh) is received, and a new mesh is generated in an empty space adjacent to the existing mesh. At operation 1602 of FIG. 14, the empty space is defined from a combination of a surface mesh and adjacent/enclosed seed volume mesh comprising elements of any shape.

In embodiments, face-based and cell-based connections can be used simultaneously for connections in different parts of the meshing domain.

At operation 1604 of FIG. 14, a dual of a layer of the existing (e.g., seed) mesh directly adjacent to the empty space is generated. The remaining seed mesh elements are kept without any modifications. A conformal connection is maintained between these two volume mesh portions.

At operation 1606, a polyhedral mesh is generated in the empty space, and the procedure ensures that the polyhedral mesh generated is conformally connected to the seed meshes. These aspects of the cell-based connection procedure are described in further detail below with reference to FIGS. 16-24.

In accordance with the cell-based procedures described herein, the input mesh is a triangular surface mesh, such as shown in FIG. 10A. In embodiments, as an example, a core hexahedral mesh with hanging nodes is generated. An example core hexahedral mesh with hanging nodes is shown in FIG. 10B. A gap region exists between the input triangular surface mesh and the exposed hexahedral mesh boundary mesh. An example gap region is the gap region 1006 shown in FIG. 10C. A polyhedral mesh is generated and used to fill the gap region.

Figure 15:
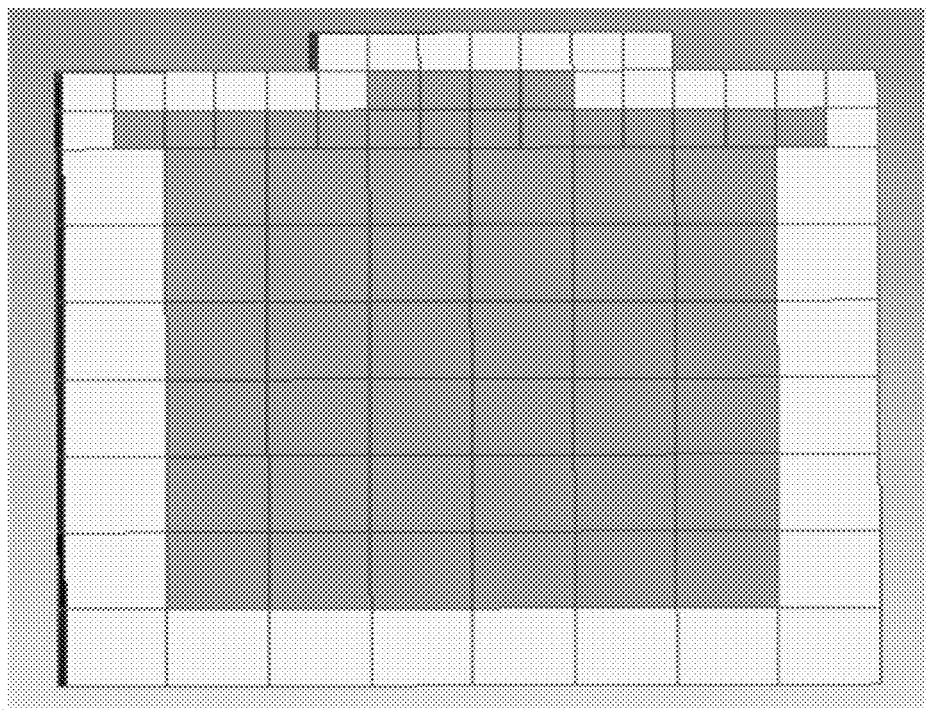
FIG. 15 illustrates the hexahedral cells to be extracted and converted to polyhedral as part of connecting the hanging node hexahedral mesh with the polyhedral mesh, in accordance with embodiments of the present disclosure.

Next, in the cell-based connection procedure, the hexahedral mesh is separated and converted to a polyhedral mesh. Specifically, in embodiments, the hexahedral cells connected to the exposed surface mesh are extracted and converted to polyhedra for preventing poly mesh with hanging nodes. This is illustrated in FIG. 15. The resulting structure has parent-child face connectivity between the separated cells and remaining hexahedral cells if there are hanging nodes. In other embodiments, all of the hexahedral mesh is converted to a poly mesh. In this process, single layer hexahedral cells are removed.

Figure 16:
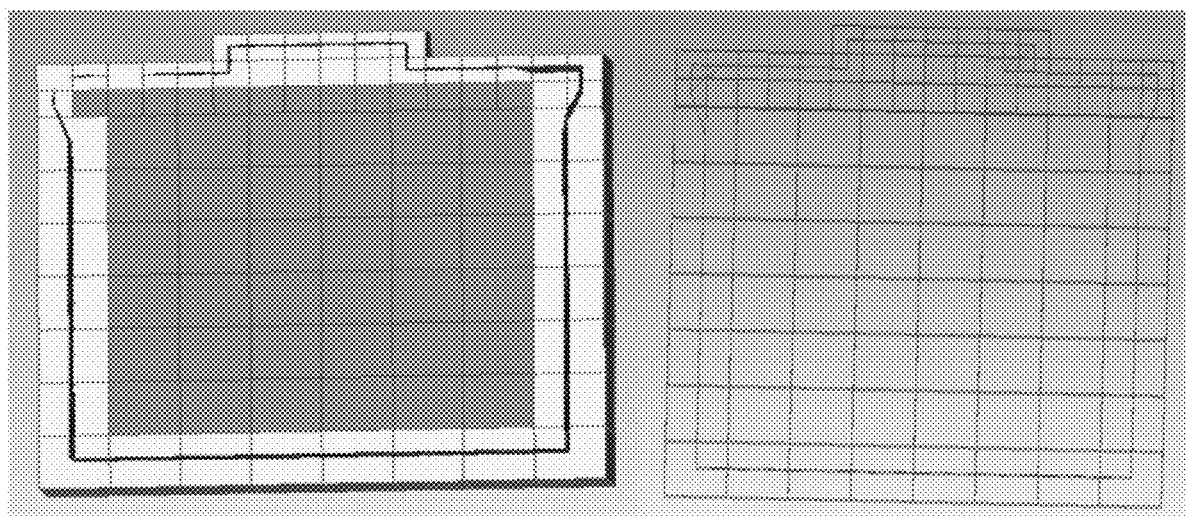
FIG. 16 illustrates a dual triangular surface mesh created by using separated poly cell centers, in accordance with embodiments of the present disclosure.
Figure 17A:
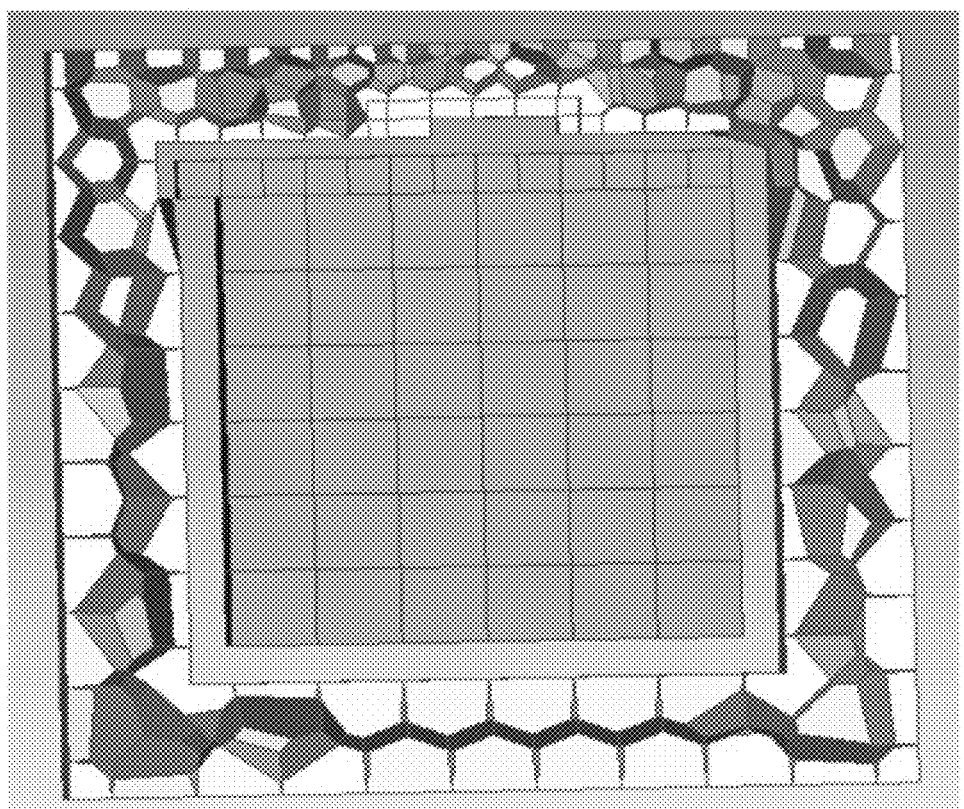
FIGS. 17A and 17B illustrate a polyhedral volume mesh created for the gap region/empty space bounded by the input triangular surface mesh and the dual mesh, in accordance with embodiments of the present disclosure.
Figure 17B:
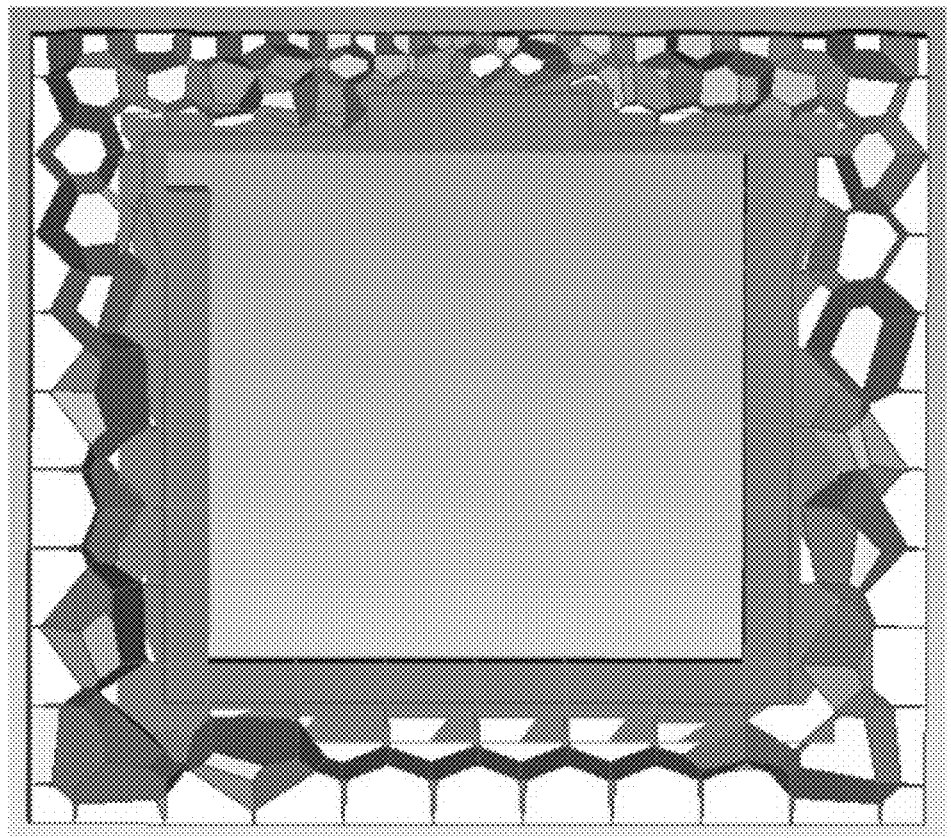
Figure 18:
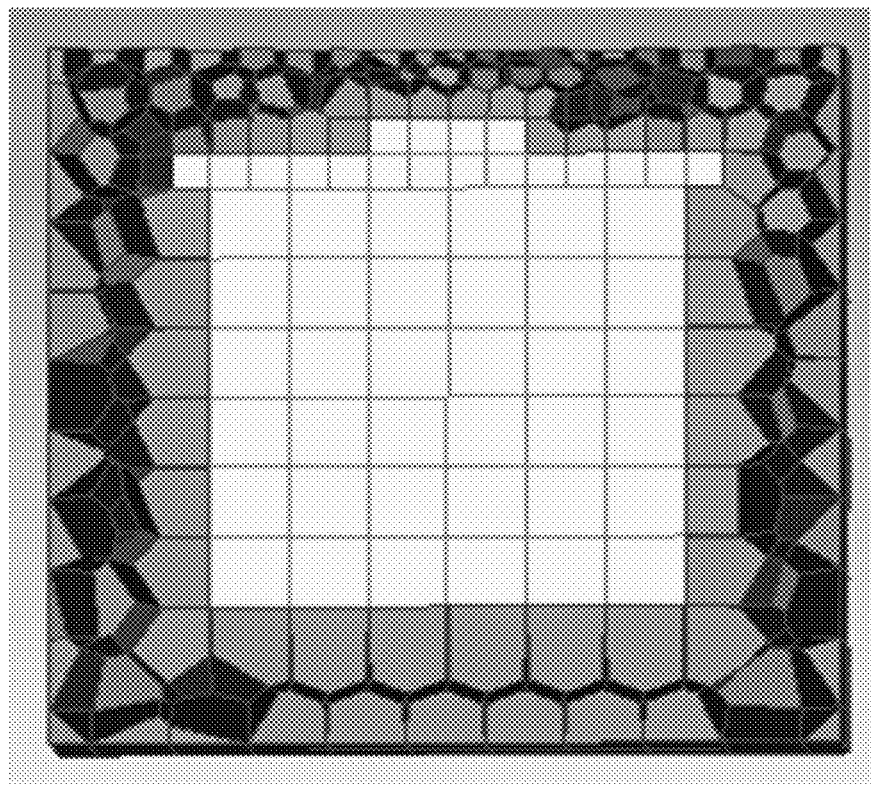
FIG. 18 shows the result of the mesh connection between the newly created polyhedral mesh and the separated poly mesh, in accordance with embodiments of the present disclosure.
Figures 19A, 19B:
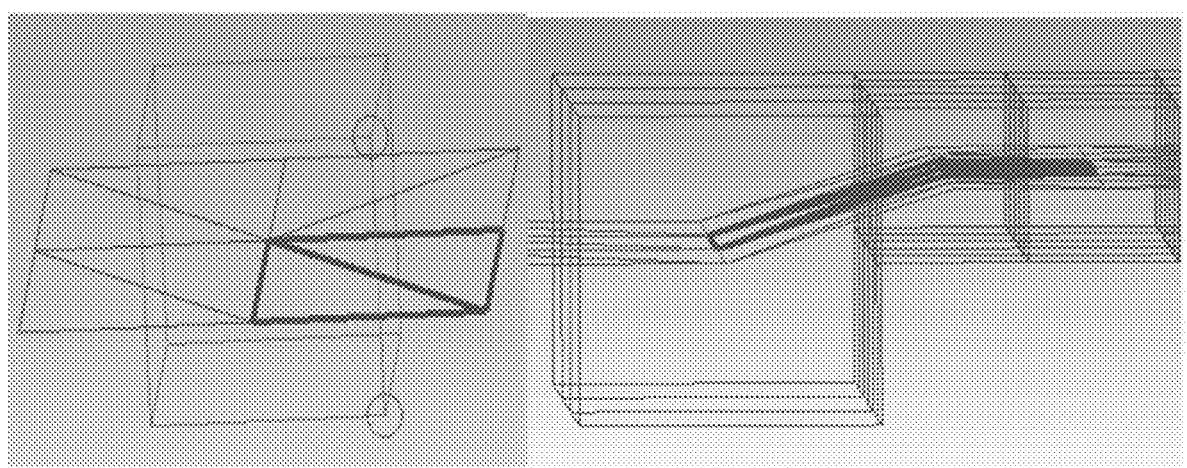
Figure 20:
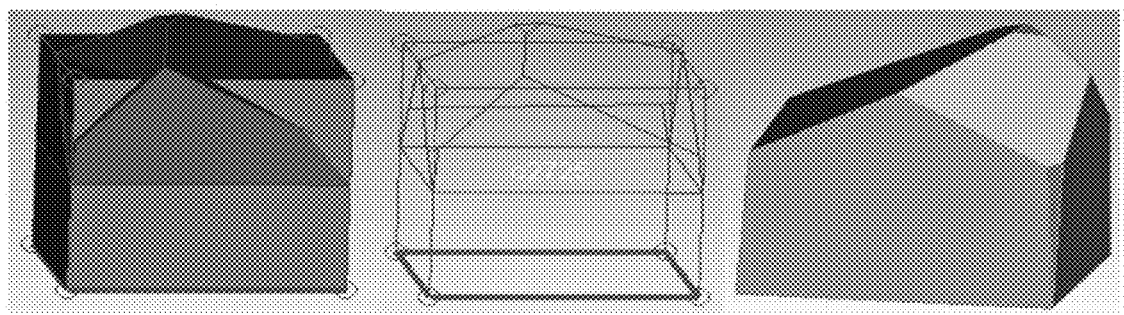
Figure 21:
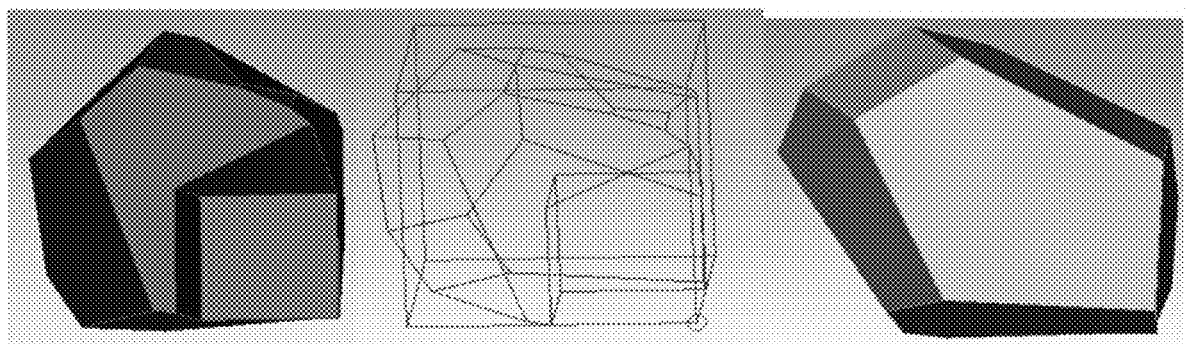
Figure 22:
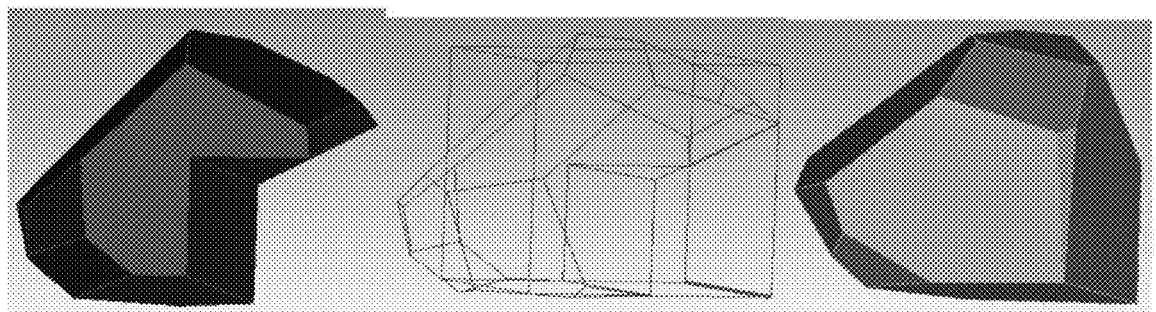
Figure 23:
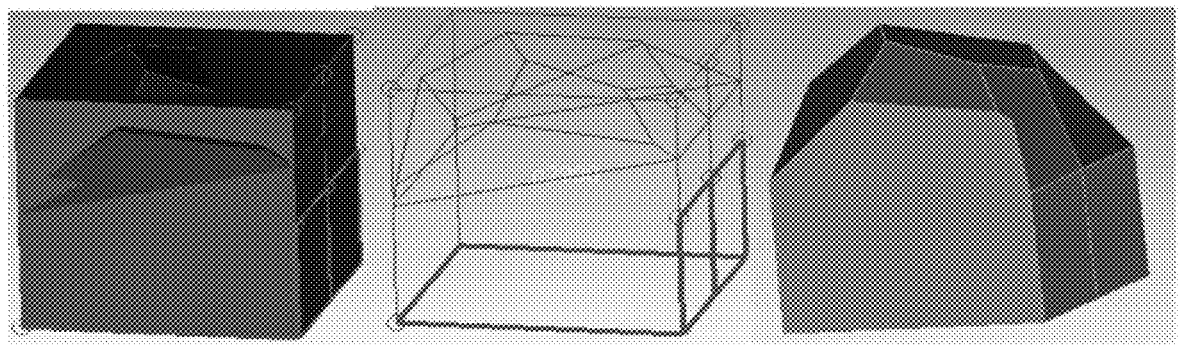
Figure 24:
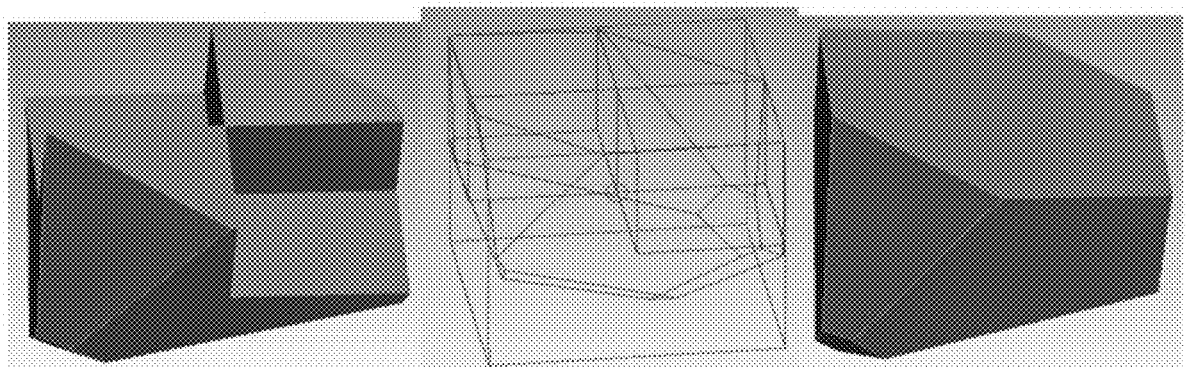

Next, in the cell-based connection procedures, dual meshes are created. As one example, as illustrated in FIG. 16, a dual triangular surface mesh is created by using the separated poly cell centers. After creating the dual triangles, a polyhedral volume mesh is created for the domain bounded by the input triangular surface mesh and the dual triangular surface mesh. This is illustrated in FIGS. 17A and 17B. FIG. 17A shows that there is a gap between the newly created poly mesh and the remaining seed mesh, and that the outermost layer of the seed mesh is overlapped by the newly created poly mesh. FIG. 18 illustrates the result of the mesh connection between the newly created polyhedral mesh to the separated seed mesh.

FIGS. 19A-24 illustrate some of the ways for connecting the seed mesh to the generated poly mesh in the empty space, in accordance with embodiments of the present disclosure.

Figure 25A:
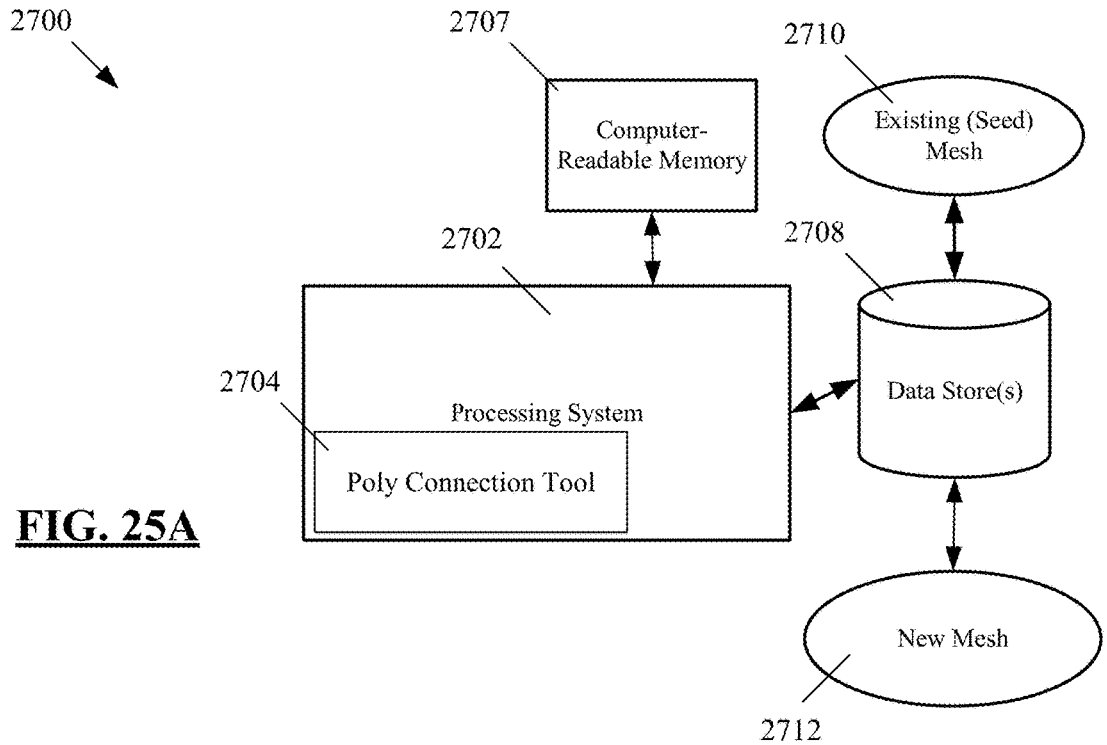
FIGS. 25A, 25B, and 25C depict example systems for implementing the techniques described herein.
Figure 25B:
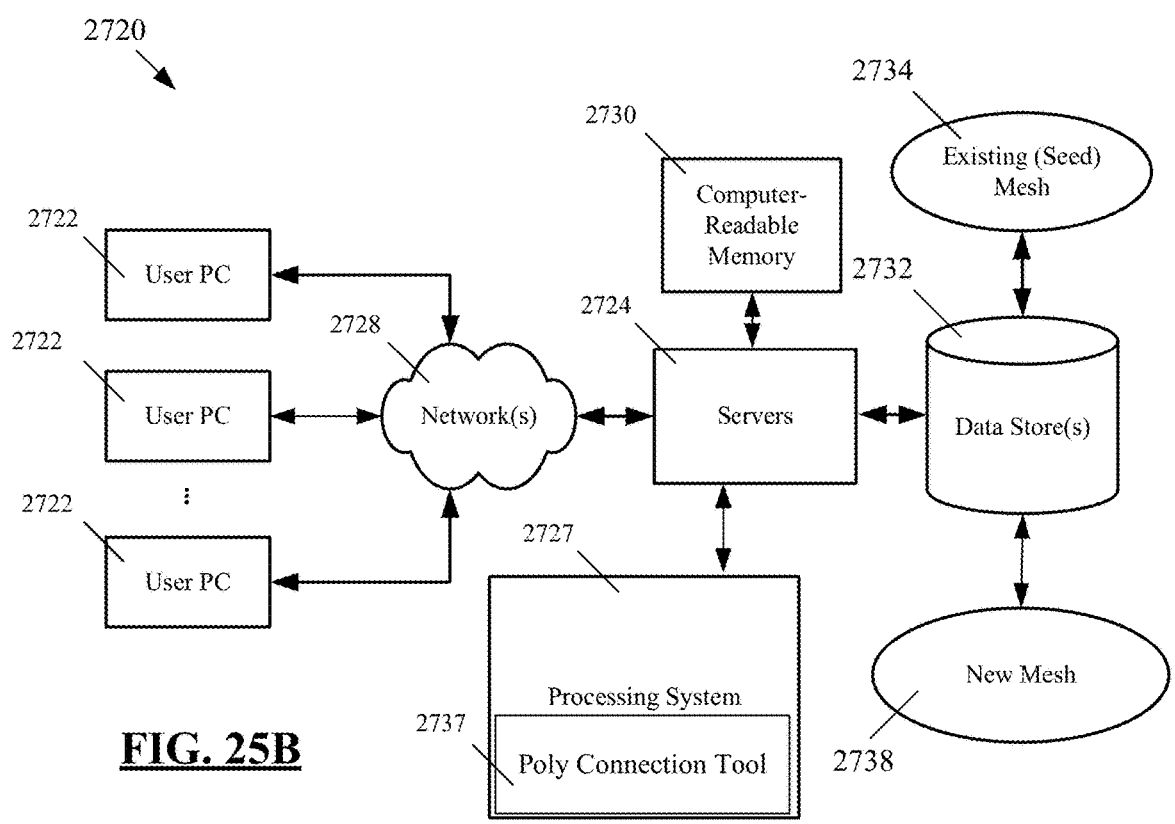
Figure 25C:
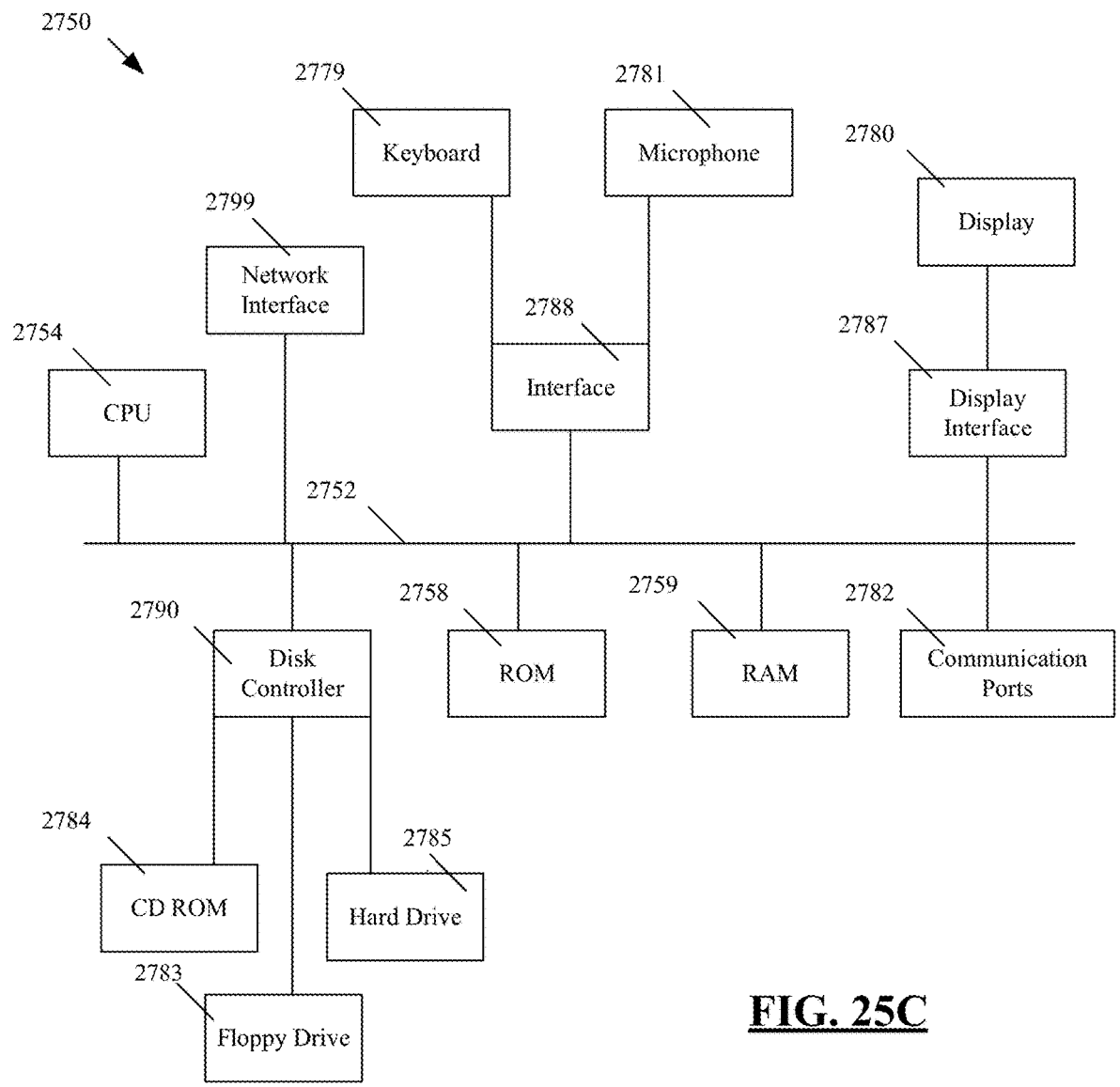

FIGS. 25A, 25B, and 25C depict example systems for implementing the techniques described herein. For example, FIG. 25A depicts an exemplary system 2700 that includes a standalone computer architecture where a processing system 2702 (e.g., one or more computer processors located in a given computer or in multiple computers that may be separate and distinct from one another) includes a poly connection tool 2704 being executed on the processing system 2702. The processing system 2702 has access to a computer-readable memory 2707 in addition to one or more data stores 2708. The one or more data stores 2708 may include data for an existing (seed) mesh 2710 as well as data for a new mesh 2712 that is to be conformally connected to the existing (seed) mesh 2710. The processing system 2702 may be a distributed parallel computing environment, which may be used to handle very large-scale data sets.

FIG. 25B depicts a system 2720 that includes a client-server architecture. One or more user PCs 2722 access one or more servers 2724 running a poly connection tool 2737 on a processing system 2727 via one or more networks 2728. The one or more servers 2724 may access a computer-readable memory 2730 as well as one or more data stores 2732. The one or more data stores 2732 may include data for an existing (seed) mesh 2734 as well as data for a new mesh 2738 that is to be conformally connected to the existing (seed) mesh 2734.

FIG. 25C shows a block diagram of exemplary hardware for a standalone computer architecture 2750, such as the architecture depicted in FIG. 25A that may be used to include and/or implement the program instructions of system embodiments of the present disclosure. A bus 2752 may serve as the information highway interconnecting the other illustrated components of the hardware. A processing system 2754 labeled CPU (central processing unit) (e.g., one or more computer processors at a given computer or at multiple computers), may perform calculations and logic operations required to execute a program. A non-transitory processor-readable storage medium, such as read only memory (ROM) 2758 and random access memory (RAM) 2759, may be in communication with the processing system 2754 and may include one or more programming instructions for performing methods (e.g., algorithms) for generating a mesh and conformally connecting the mesh to an existing mesh. Optionally, program instructions may be stored on a non-transitory computer-readable storage medium such as a magnetic disk, optical disk, recordable memory device, flash memory, or other physical storage medium.

In FIGS. 25A, 25B, and 25C, computer readable memories 2707, 2730, 2758, 2759 or data stores 2708, 2732, 2783, 2784 may include one or more data structures for storing and associating various data used in the example systems described herein. For example, a data structure stored in any of the aforementioned locations may be used to store data for an existing mesh and/or data for a new mesh to be conformally connected to the existing mesh. A disk controller 2790 interfaces one or more optional disk drives to the system bus 2752. These disk drives may be external or internal floppy disk drives such as 2783, external or internal CD-ROM, CD-R, CD-RW or DVD drives such as 2784, or external or internal hard drives 2785. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 2790, the ROM 2758 and/or the RAM 2759. The processor 2754 may access one or more components as required.

A display interface 2787 may permit information from the bus 2752 to be displayed on a display 2780 in audio, graphic, or alphanumeric format. Communication with external devices may optionally occur using various communication ports 2782.

In addition to these computer-type components, the hardware may also include data input devices, such as a keyboard 2779, or other input device 2781, such as a microphone, remote control, pointer, mouse and/or joystick. Such data input devices communicate with the standalone computer architecture 2750 via an interface 2788, in some embodiments. The standalone computer architecture 2750 further includes a network interface 2799 that enables the architecture 2750 to connect to a network, such as a network of the one or more networks 2728.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, C#, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A computer-implemented method comprising:
   displaying an existing mesh via a graphical user interface (GUI) of a computer-aided design modeling system using a processing system, wherein an empty space adjacent to the existing mesh is defined based on a first surface mesh comprising triangles, quadrilaterals, polygonals, or a mixture thereof; and
   generating a polyhedral mesh in the empty space using the processing system, the generating of the polyhedral mesh including:
   (i) generating a dual of the first surface mesh to form a second surface mesh, the empty space being enclosed by the second surface mesh, and
   (ii) filling the empty space with the polyhedral mesh conformally connected to the first surface mesh using the processing system;
   wherein a portion of the first surface mesh is preserved in a boundary of the polyhedral mesh.

2. The computer-implemented method of claim 1, wherein the generating of the polyhedral mesh further comprises generating a dual of a portion of the second surface mesh.

3. The computer-implemented method of claim 1, wherein the first surface mesh is associated with the existing.

4. The computer-implemented method of claim 1, wherein the existing mesh and the polyhedral mesh represent a physical object or a portion thereof, the method further comprising:
   using physical data associated with the physical object to generate a model, the model comprising a virtual 3D object for modeling the physical object; and
   performing a computer-based analysis of the existing mesh, the polyhedral mesh, and the model, wherein the physical object is built or modified based on the computer-based analysis.

5. The computer-implemented method of claim 1, wherein a volume mesh is associated with a subset of the first surface mesh.

6. The computer-implemented method of claim 1, wherein the generating of the polyhedral mesh further comprises:
   replacing the first surface mesh with a polyhedral surface mesh except for certain surface elements of the first surface mesh.

7. The computer-implemented method of claim 6, wherein the certain surface elements of the first surface mesh are not changed.

8. A system for constructing conformal connections between meshes, the system comprising:
   a processing system; and
   computer-readable memory in communication with the processing system encoded with instructions for commanding the processing system to execute operations comprising:
   displaying an existing mesh via a graphical user interface (GUI) of a computer-aided design modeling system using a processing system, wherein an empty space adjacent to the existing mesh is defined based on a first surface mesh comprising triangles, quadrilaterals, polygonals, or a mixture thereof; and
   generating a polyhedral mesh in the empty space using the processing system, the generating of the polyhedral mesh including:
   (i) generating a dual of the first surface mesh to form a second surface mesh, the empty space being enclosed by the second surface mesh, and
   (ii) filling the empty space with the polyhedral mesh conformally connected to the first surface mesh using the processing system;
   wherein a portion of the first surface mesh is preserved in a boundary of the polyhedral mesh.

9. The system of claim 8, wherein the generating of the polyhedral mesh further comprises generating a dual of a portion of the second surface mesh.

10. The system of claim 8, wherein the first surface mesh is associated with the existing mesh.

11. The system of claim 8, wherein the existing mesh and the polyhedral mesh represent a physical object or a portion thereof, the operations further comprising:
　using physical data associated with the physical object to generate a model, the model comprising a virtual 3D object for modeling the physical object; and
　performing a computer-based analysis of the existing mesh, the polyhedral mesh, and the model, wherein the physical object is built or modified based on the computer-based analysis.

12. The system of claim 8, wherein a volume mesh is associated with a subset of the first surface mesh, and the polyhedral mesh is conformally connected to the volume mesh.

13. The system of claim 8, wherein the generating of the polyhedral mesh further comprises:
　replacing the first surface mesh with a polyhedral surface mesh except for certain surface elements of the first surface mesh.

14. The system of claim 13, wherein the surface elements of the first surface mesh are not changed.

15. A non-transitory computer-readable storage medium for constructing conformal connections between meshes, the computer-readable storage medium comprising computer executable instructions which, when executed, cause a processing system to execute operations comprising:
　displaying an existing mesh via a graphical user interface (GUI) of a computer-aided design modeling system using a processing system, wherein an empty space adjacent to the existing mesh is defined based on a first surface mesh comprising triangles, quadrilaterals, polygonals, or a mixture thereof; and
　generating a polyhedral mesh in the empty space using the processing system, the generating of the polyhedral mesh including:
　　(i) generating a dual of the first surface mesh to form a second surface mesh, the empty space being enclosed by the second surface mesh, and
　　(ii) filling the empty space with the polyhedral mesh conformally connected to the first surface mesh using the processing system;
　wherein a portion of the first surface mesh is preserved in a boundary of the polyhedral mesh.

16. The non-transitory computer-readable storage medium of claim 15, wherein the generating of the new mesh further comprises generating a dual of a part of the second surface mesh.

17. The non-transitory computer-readable storage medium of claim 15, wherein the first surface mesh is associated with the existing mesh.

18. The non-transitory computer-readable storage medium of claim 15, wherein the existing mesh and the new mesh represent a physical object or a portion thereof, the operations further comprising:
　using physical data associated with the physical object to generate a model, the model comprising a virtual 3D object for modeling the physical object; and
　performing a computer-based analysis of the existing mesh, the new mesh, and the model, wherein the physical object is built or modified based on the computer-based analysis.

19. The non-transitory computer-readable storage medium of claim 15, wherein the polyhedral mesh remains conformally connected to a seed surface or volume mesh.

20. The non-transitory computer-readable storage medium of claim 15, wherein the generating of the new mesh further comprises:
　replacing the first surface mesh with a polyhedral surface mesh except for certain surface elements of the first surface mesh that are not changed.

* * * * *